United States Patent
Tsuji et al.

(10) Patent No.: US 9,691,786 B1
(45) Date of Patent: Jun. 27, 2017

(54) SEMICONDUCTOR MEMORY DEVICE

(71) Applicant: KABUSHIKI KAISHA TOSHIBA, Minato-ku (JP)

(72) Inventors: Masaki Tsuji, Yokkaichi (JP); Hideaki Aochi, Yokkaichi (JP); Jun Fujiki, Mie (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/253,244

(22) Filed: Aug. 31, 2016

Related U.S. Application Data (60) Provisional application No. 62/329,296, filed on Apr. 29, 2016.

(51) Int. Cl.
| | |
|---|---|
| *H01L 27/1157* | (2017.01) |
| *H01L 27/11582* | (2017.01) |
| *H01L 27/11556* | (2017.01) |
| *H01L 29/792* | (2006.01) |

(52) U.S. Cl.
CPC .... *H01L 27/11582* (2013.01); *H01L 27/1157* (2013.01); *H01L 27/11556* (2013.01); *H01L 29/792* (2013.01)

(58) Field of Classification Search
CPC .................................................. H01L 21/8232
See application file for complete search history.

(56) References Cited

U.S. PATENT DOCUMENTS

| | | |
|---|---|---|
| 2007/0252201 A1 | 11/2007 | Kito et al. |
| 2008/0173932 A1 | 7/2008 | Kidoh et al. |
| 2010/0207195 A1 | 8/2010 | Fukuzumi et al. |
| 2012/0181602 A1 | 7/2012 | Fukuzumi et al. |
| 2014/0124850 A1 | 5/2014 | Tanaka et al. |

FOREIGN PATENT DOCUMENTS

| | | |
|---|---|---|
| JP | 2009-146954 | 7/2009 |
| JP | 2012-146861 | 8/2012 |
| JP | 5016832 | 9/2012 |
| JP | 5016928 | 9/2012 |
| JP | 5091526 | 12/2012 |

*Primary Examiner* — Cheung Lee
(74) *Attorney, Agent, or Firm* — Oblon, McClelland, Maier & Neustadt, L.L.P.

(57) ABSTRACT

A semiconductor memory device according to an embodiment includes: a first semiconductor layer; and a memory cell array on the first semiconductor layer, the memory cell array including a source line, a second semiconductor layer, and a conductive layer, those are sequentially disposed in a first direction and the memory cell array further including a third semiconductor layer which is columnar and extends in the first direction and a charge accumulation film disposed between the conductive layer and the third semiconductor layer, wherein the second semiconductor layer includes a first impurity region of a first conductivity type disposed at a position of the third semiconductor layer as viewed from the first direction and a second impurity region adjacent to the first impurity region which has a second conductivity type different from the first conductivity type.

19 Claims, 13 Drawing Sheets

SEMICONDUCTOR MEMORY DEVICE

CROSS-REFERENCE TO RELATED APPLICATION

This application is based upon and claims the benefit of priority from the prior U.S. Provisional Application 62/329,296, filed on Apr. 29, 2016, the entire contents of which are incorporated herein by reference.

BACKGROUND

Field

Embodiments of the present invention relate to a semiconductor memory device.

Description of the Related Art

One kind of semiconductor memory device is a flash memory. In particular, a NAND type flash memory is generally widely used since it is low cost and has a large capacity. Moreover, up to now, many technologies for further increasing the capacity of this NAND type flash memory have been proposed. One such technology is a structure in which memory cells are disposed three-dimensionally.

DETAILED DESCRIPTION

A semiconductor memory device according to an embodiment includes: a first semiconductor layer; and a memory cell array on the first semiconductor layer, the memory cell array including a source line, a second semiconductor layer, and a conductive layer, those are sequentially disposed in a first direction and the memory cell array further including a third semiconductor layer which is columnar and extends in the first direction and a charge accumulation film disposed between the conductive layer and the third semiconductor layer, wherein the second semiconductor layer includes a first impurity region of a first conductivity type disposed at a position of the third semiconductor layer as viewed from the first direction and a second impurity region adjacent to the first impurity region which has a second conductivity type different from the first conductivity type.

Semiconductor memory devices according to embodiments will be described below with reference to the drawings.

First Embodiment

First, an overall configuration of a semiconductor memory device according to a first embodiment will be described.

Figure 1:
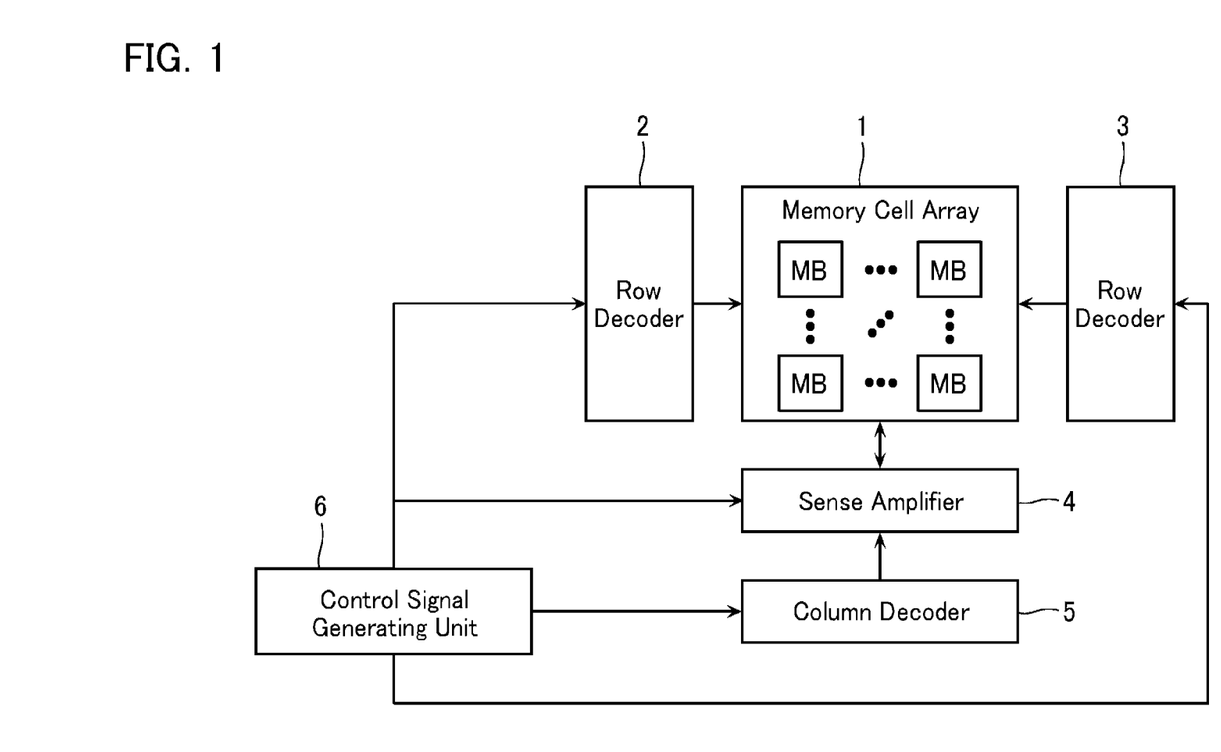
FIG. 1 is a view showing functional blocks of a semiconductor memory device according to a first embodiment.

FIG. 1 is a view showing functional blocks of the semiconductor memory device according to the present embodiment.

The semiconductor memory device according to the present embodiment includes: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory transistors MT, that is, a plurality of memory cells MC, that are arranged three-dimensionally therein, and configures a unit of an erase operation of data. Note that each of the memory blocks MB is divided by a plurality of element isolation trenches extending in one direction. Hereafter, each portion divided by the element isolation trench will sometimes also be referred to as a "memory finger MF". The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or erase operation, generates a control signal and controls the row decoders 2 and 3, the sense amplifier 4, and the column decoder 5.

Next, a structure of the memory cell array 1 will be described.

Figure 2:
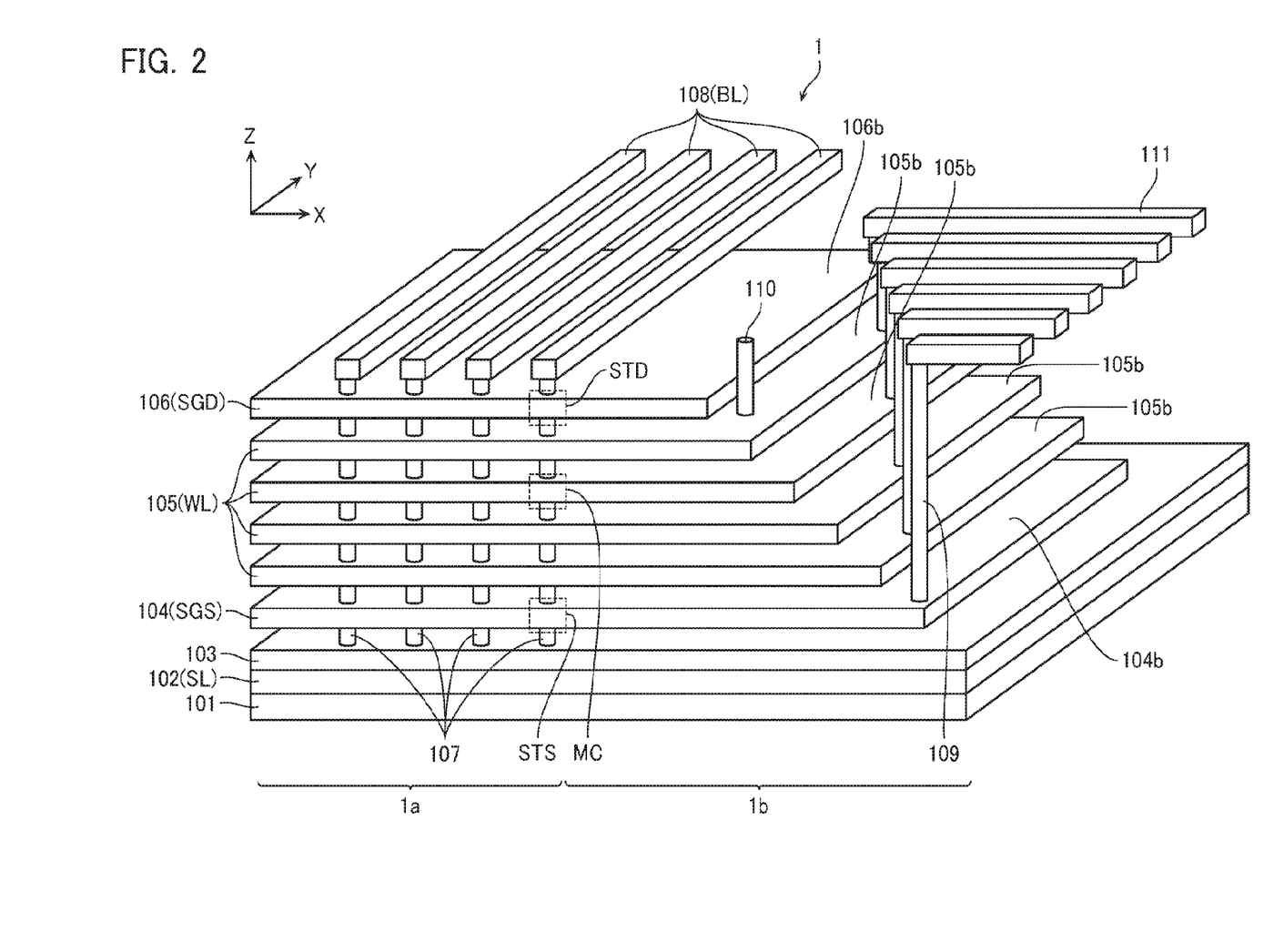
FIG. 2 is a perspective view showing a structure of a memory cell array of the semiconductor memory device according to the same embodiment.

FIG. 2 is a perspective view showing the structure of the memory cell array of the semiconductor memory device according to the present embodiment. Note that FIG. 2 is one example of the structure of the memory cell array 1, and the numbers of each of configurations, and so on, are not limited to those of FIG. 2.

As shown in FIG. 2, the memory cell array 1 includes: a semiconductor substrate 101 (first semiconductor layer); and a source line 102 (SL) and semiconductor layer 103 (second semiconductor layer) that are disposed sequentially in a Z direction on the semiconductor substrate 101.

In addition, the memory cell array 1 includes a plurality of conductive layers 104-106 stacked in the Z direction on the semiconductor layer 103. The conductive layer 104 functions as a source side select gate line SGS. The conductive layer 105 functions as a word line WL. The conductive layer 106 functions as a drain side select gate line SGD. Hereafter, the source side select gate line SGS and the drain side select gate line SGD will sometimes also be referred to simply as "select gate lines".

In addition, the memory cell array 1 includes a plurality of memory columnar bodies 107 extending in the Z direction. An intersection of the conductive layer 104 and the memory columnar body 107 functions as a source side select transistor STS. An intersection of the conductive layer 105 and the memory columnar body 107 functions as the memory cell MC (memory transistor MT). An intersection of the conductive layer 106 and the memory columnar body 107 functions as a drain side select transistor STD. Hereafter, the source side select transistor STS and the drain side select transistor STD will sometimes also be referred to simply as "select transistors".

The conductive layers 104-106 have their ends formed in a stepped shape. That is, a certain conductive layer 104-106 has a contact part 104b-106b that does not face a lower surface of another conductive layer 104-106 positioned in a layer above. Moreover, the conductive layer 104-106 is connected to a via 109 at this contact part 104b-106b. A wiring line 111 is disposed at an upper end of the via 109.

Note that the via 109 and the wiring line 111 are formed by the likes of tungsten (W), for example.

In addition, the memory cell array 1 includes a plurality of conductive lines 108 that are positioned upwardly of the conductive layers 104-106 and memory columnar bodies 107 and that are aligned in plurality in an X direction and extend in a Y direction. The memory columnar bodies 107 are respectively electrically connected to lower surfaces of the conductive lines 108. Note that the conductive line 108 is formed from the likes of tungsten (W), for example, and functions as a bit line BL.

Furthermore, the memory cell array 1 includes a beam columnar body 110. The beam columnar body 110 maintains a posture of an unillustrated inter-layer insulating layer disposed between the conductive layers 104-106 in a manufacturing step.

Note that hereafter, a region where the memory columnar bodies 107 are disposed, of the memory cell array 1 will sometimes also be referred to as a "memory region 1a", and a region where the contact parts 104b-106b of the conductive layers 104-106 are formed, of the memory cell array 1 will sometimes also be referred to as a "contact region 1b".

Next, a structure of the memory columnar body 107 and its periphery will be described.

Figure 3:
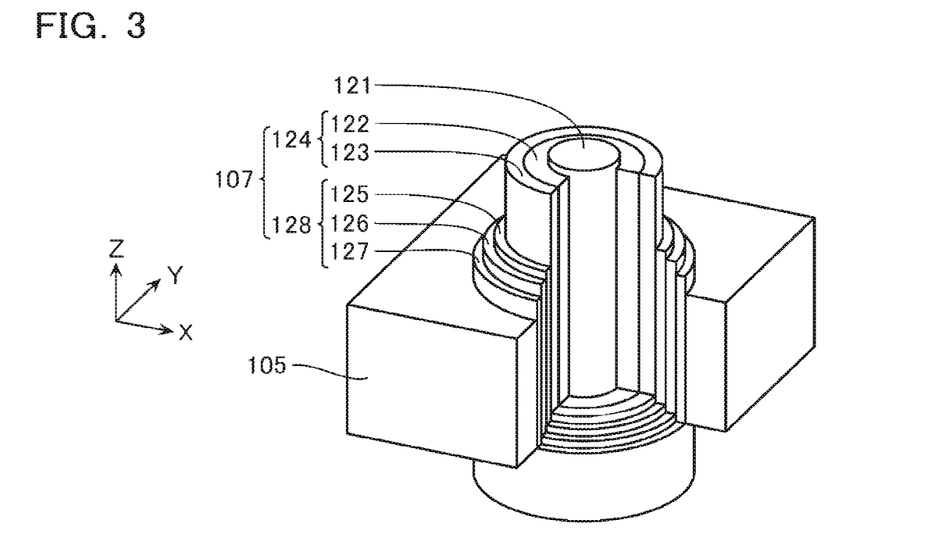
FIG. 3 is a perspective view showing a structure of a memory columnar body and a periphery thereof, of the memory cell array of the semiconductor memory device according to the same embodiment.

FIG. 3 is a perspective view showing the structure of the memory columnar body and the periphery thereof, of the memory cell array of the semiconductor memory device according to the present embodiment.

The memory columnar body 107 includes the following, stacked from the center to the outside, namely: a core oxide film 121; a channel semiconductor layer 124 (third semiconductor layer); and a multi-layer film 128. The channel semiconductor layer 124 includes semiconductor films 122 and 123. The multi-layer film 128 includes a tunnel insulating film 125, a charge accumulation film 126, and a block insulating film 127. The core oxide film 121 is formed by silicon oxide ($SiO_2$), for example. The semiconductor films 122 and 123 are formed by, for example, silicon (Si), silicon germanium (SiGe), silicon carbide (SiC), germanium (Ge), or carbon (C). The tunnel insulating film 125 and block insulating film 127, as well as being formed by silicon oxide ($SiO_x$), are formed by, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO. The charge accumulation film 126 is formed by silicon nitride (SiN), for example. Note that the tunnel insulating film 125 and charge accumulation film 126 may be formed in an entire longitudinal direction of the memory columnar body 107, or may be formed only at positions of side surfaces of the conductive layers 104-106. Moreover, the channel semiconductor layer 124 may be configured by one semiconductor film.

Hereafter, a group of the memory transistors MT sharing one memory columnar body 107 will sometimes also be referred to as a "memory string MS", and a group of the memory string MS and the select transistors STS and STD sharing one memory columnar body 107 will sometimes also be referred to as a "memory unit MU".

Next, an equivalent circuit of the memory unit MU will be described.

Figure 4:
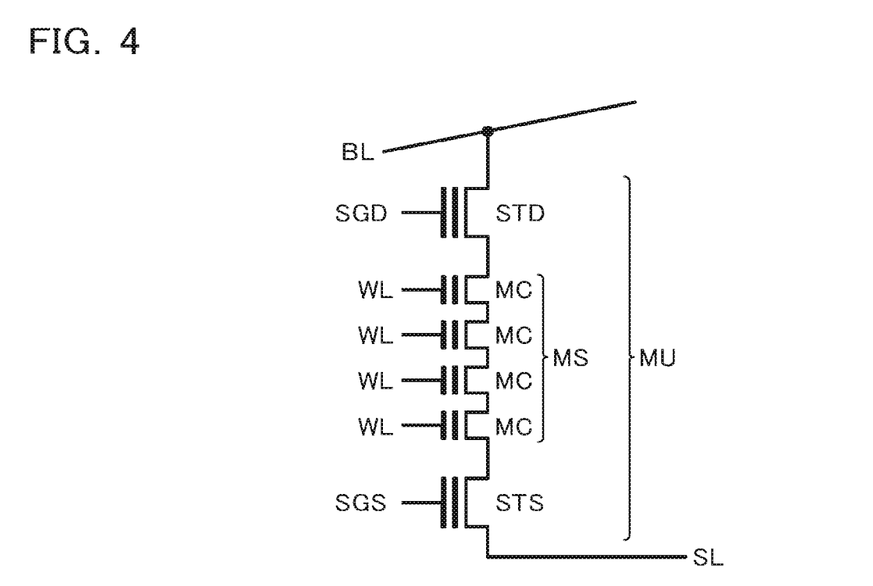
FIG. 4 is an equivalent circuit diagram of a memory unit of the memory cell array of the semiconductor memory device according to the same embodiment.

FIG. 4 is an equivalent circuit diagram of the memory unit of the memory cell array of the semiconductor memory device according to the present embodiment.

Each memory unit MU of the memory cell array 1 has the source side select transistor STS, the memory string MS, and the drain side select transistor STD connected in series therein. The memory string MS has the memory transistors MT connected in series therein. The source side select transistor STS is electrically connected between the source line SL and one end of the memory string MS. The drain side select transistor STD is electrically connected between the bit line BL and the other end of the memory string MS.

Next, the structure of the memory cell array 1 will be described in detail.

Figure 5:
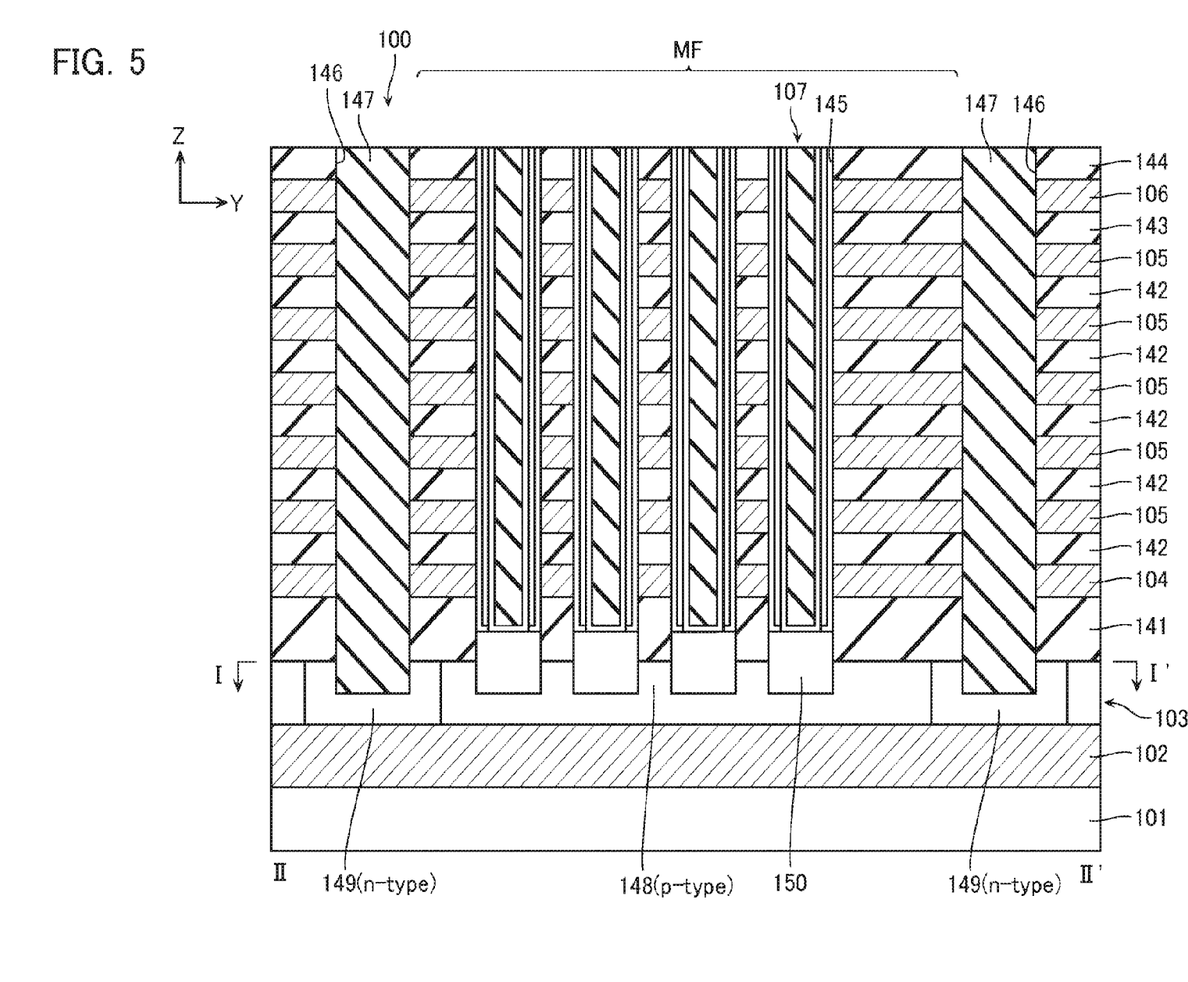
FIG. 5 is a cross-sectional view of the memory cell array of the semiconductor memory device according to the same embodiment.
Figure 6:
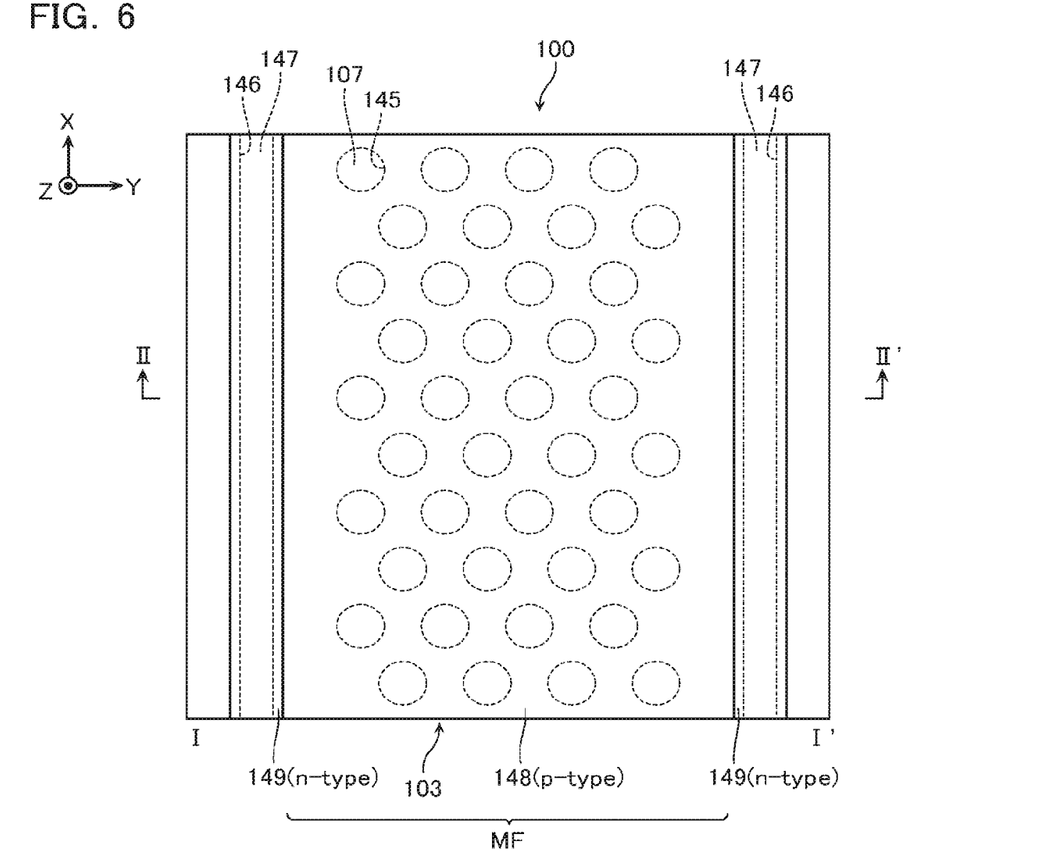
FIG. 6 is a cross-sectional view showing a layout of a semiconductor layer of the memory cell array of the semiconductor memory device according to the same embodiment.

FIG. 5 is a cross-sectional view of the memory cell array of the semiconductor memory device according to the present embodiment. FIG. 6 cross-sectional is a view showing a layout of the semiconductor layer of the memory cell array of the same semiconductor memory device. FIG. 5 is a cross-sectional view in the X-Y directions taken along the line II-II' of FIG. 6. FIG. 6 is a cross-sectional view in the Y-Z directions taken along the line I-I' of FIG. 5. Hereafter, the memory cell array 1 of the present embodiment will be described as a memory cell array 100 in order to distinguish it from a memory cell array of another embodiment.

The memory cell array 100 includes the source line 102 and the semiconductor layer 103 that are stacked on the semiconductor substrate 101. In addition, the memory cell array 100 includes: the conductive layer 104 stacked via an inter-layer insulating layer 141; a plurality of the conductive layers 105 stacked, via an inter-layer insulating layer 142, on the conductive layer 104; the conductive layer 106 stacked, via an inter-layer insulating layer 143, on the conductive layer 105; and an inter-layer insulating layer 144 stacked on the conductive layer 106. The source line 102 is formed by, for example, a material of high conductivity, of the likes of a metal such as tungsten silicide ($WSi_x$), a compound of these metals, a semiconductor such as silicon that includes an impurity in high concentration, and so on. The conductive layers 104-106 are formed by, for example, tungsten (W), polysilicon (Poly-Si) that includes an impurity in high concentration, and so on. The inter-layer insulating layers 141-144 are formed by silicon oxide ($SiO_2$), for example.

Moreover, the memory region 1a of the memory cell array 100 has formed therein a plurality of memory holes 145 that penetrate in the Z direction from the inter-layer insulating layer 141 to the inter-layer insulating layer 144 and reach a semiconductor layer 103 upper part. These memory holes 145 are each implanted with the memory columnar body 107.

Moreover, the memory cell array 100 has formed therein, from the inter-layer insulating layer 141 to the inter-layer insulating layer 144, a plurality of element isolation trenches 146 that have the Z direction as their depth direction and have the X direction as their extension direction. The element isolation trench 146 is implanted with an insulating layer 147. A stacked body sandwiched by two insulating layers 147 configures the memory finger MF.

Now, the semiconductor layer 103 includes: a p type impurity region 148 disposed at a position of the memory columnar body 107 as viewed from the Z direction; and n type impurity regions 149 adjacent to this p type impurity region 148 so as to sandwich the p type impurity region 148 in the Y direction. The p type impurity region 148 is formed by a semiconductor such as polysilicon (Poly-Si) including a p type impurity such as boron (B), for example. The n type impurity region 149 is formed by a semiconductor such as polysilicon (Poly-Si) including an n type impurity such as phosphorus (P), for example. Moreover, the semiconductor layer 103 may include a semiconductor portion 150 projecting toward the Z direction with respect to a bottom part of the memory hole 145, in such cases as when the semiconductor layer 103 upper part has ended up being deeply hollowed out during formation of the memory hole 145. This semiconductor portion 150 is formed by epitaxial growth using silicon (Si) as a material, for example.

Note that when later-described manufacturing steps of the memory cell array 100 are employed, the n type impurity region 149 is formed linearly extending in the X direction at a position of the insulating layer 147 as viewed from the Z direction and having a certain width in the Y direction, as shown in FIG. 6, but the present embodiment is not limited to this.

Next, the manufacturing steps of the memory cell array 100 will be described.

Figure 7:
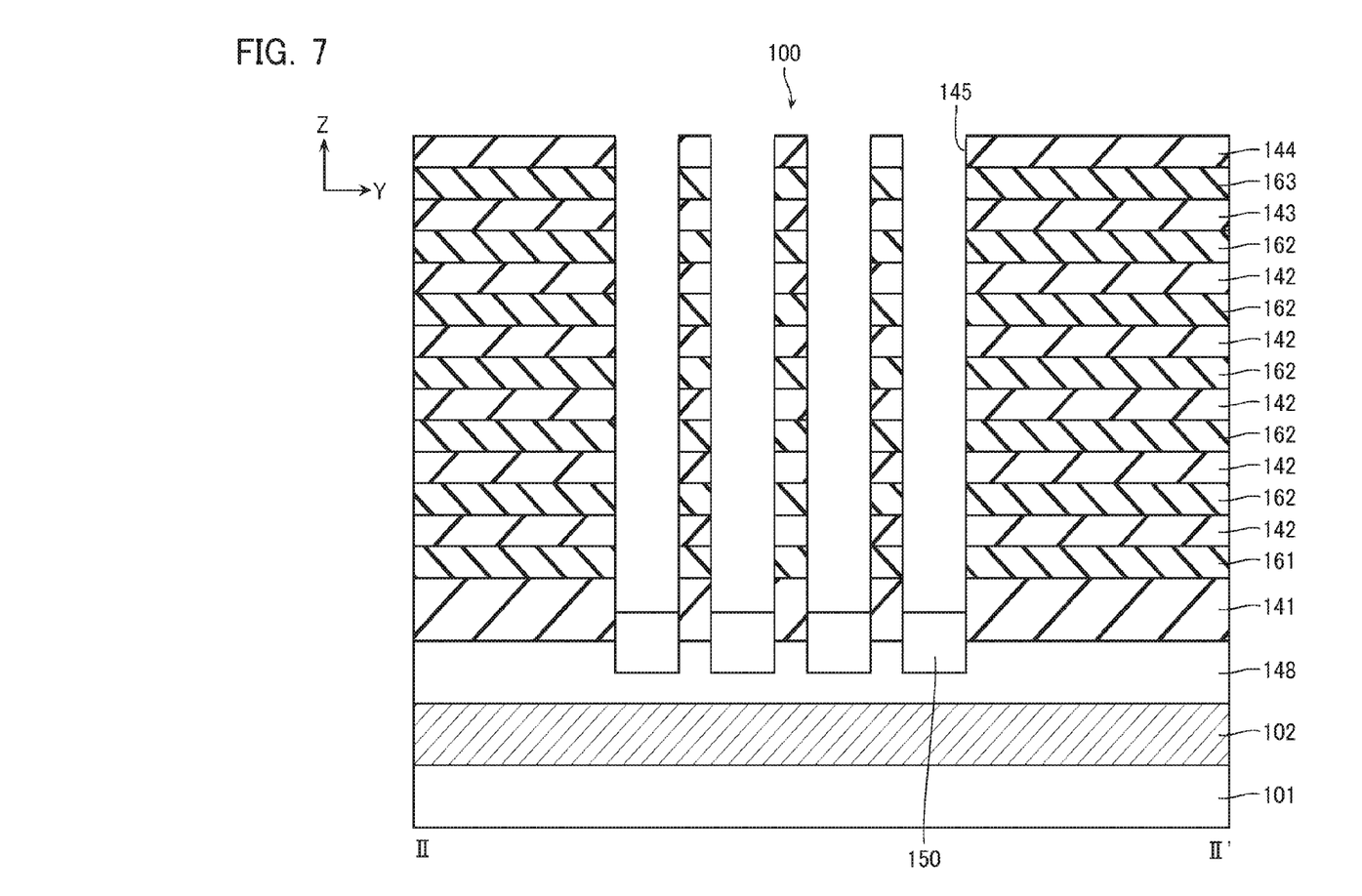
FIGS. 7 and 8 are views explaining manufacturing steps of the memory cell array of the semiconductor memory device according to the same embodiment.
Figure 8:
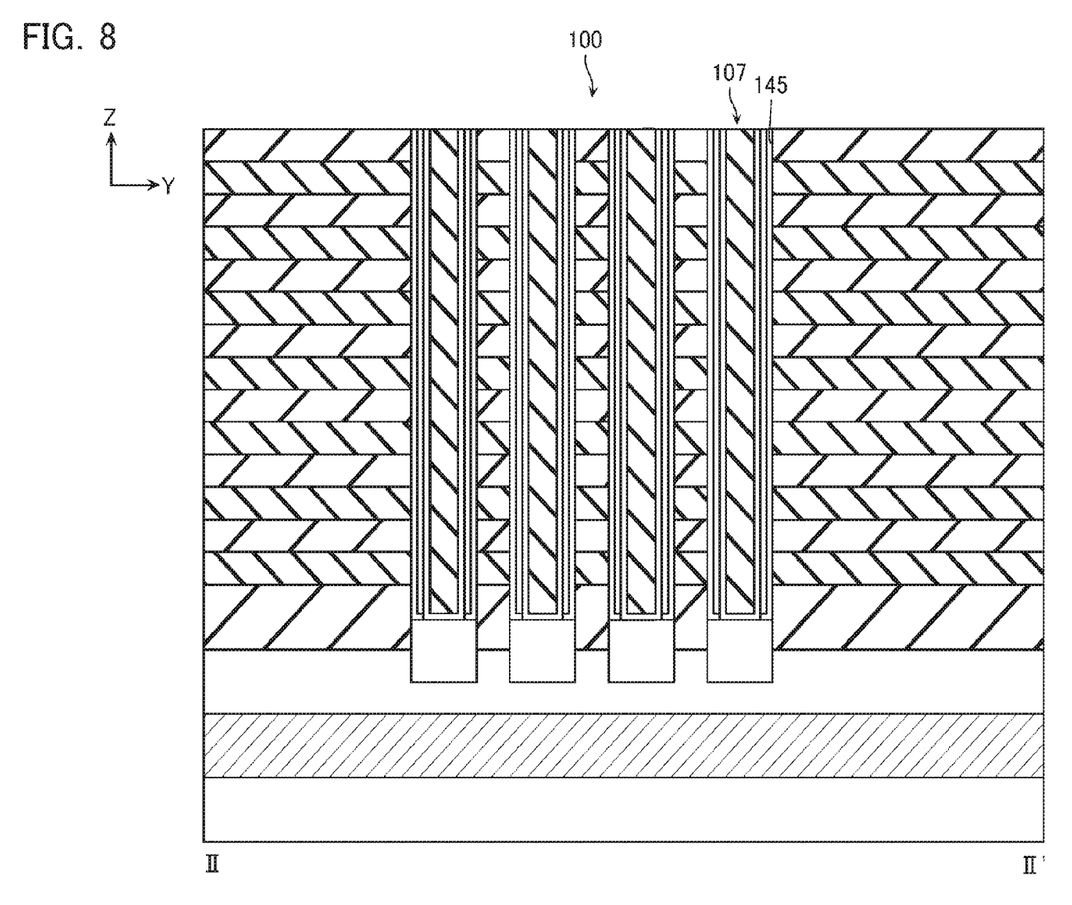

FIGS. 7 and 8 are views explaining the manufacturing steps of the memory cell array of the semiconductor memory device according to the present embodiment. FIGS. 7 and 8 are cross-sectional views in the Y-Z directions taken along the line II-II' of FIG. 6.

First, the source line 102 which is plate-like and extends in the X-Y directions is stacked in the Z direction on the semiconductor substrate 101. The source line 102 is formed by, for example, a material of high conductivity, of the likes of a metal such as tungsten silicide ($WSi_x$), a compound of these metals, or a semiconductor such as silicon that includes an impurity in high concentration, and so on. Next, a semiconductor layer 148 is stacked in the Z direction on the source line 102. The semiconductor layer 148 is formed by a semiconductor such as polysilicon (Poly-Si) including a p type impurity such as boron (B), for example. This semiconductor layer 148 may have its crystallinity raised by metal-induced lateral crystallization, for example. Next, the inter-layer insulating layer 141 and a sacrifice layer 161 are stacked in the Z direction on the semiconductor layer 148. Next, a plurality of the inter-layer insulating layers 142 and sacrifice layers 162 are stacked alternately in the Z direction on the sacrifice layer 161. Next, the inter-layer insulating layer 143, a sacrifice layer 163, and the inter-layer insulating layer 144 are stacked in the Z direction on the sacrifice layer 162. The sacrifice layers 161-163 are formed by silicon nitride (SiN), for example. The inter-layer insulating layers 141-144 are configured from a silicon oxide film (dTEOS) formed by plasma CVD, for example. Next, a plurality of the memory holes 145 extending in the Z direction and reaching an upper surface of the semiconductor layer 148 are formed from the inter-layer insulating layer 144 to the inter-layer insulating layer 141, by anisotropic etching, for example. Subsequently, in such cases as when the memory hole 145 has penetrated the semiconductor layer 103 to reach an upper surface of the source line 102, if necessary, the semiconductor portion 150 may be formed from the upper surface of the semiconductor layer 148 that has appeared in a bottom part of the memory hole 145 to a height not reaching a lower surface of the sacrifice layer 161, by solid phase epitaxial growth, for example. By steps so far, the stacked body shown in FIG. 7 is formed on the semiconductor substrate 101.

Next, the block insulating film 127, the charge accumulation film 126, and the tunnel insulating film 125 are deposited sequentially on a sidewall of the memory hole 145. The tunnel insulating film 125 and the block insulating film 127 are formed by silicon oxide ($SiO_2$), for example. The charge accumulation film 126 is formed by silicon nitride (SiN), for example. Next, the semiconductor film 123 is deposited on a sidewall of the tunnel insulating film 125. The semiconductor film 123 is formed by amorphous silicon (a-Si), for example. Note that before deposition of the block insulating film 127, the following may be deposited on the sidewall of the memory hole 145, namely, a high permittivity film that adjusts permittivity of the block insulating film 127 or a cover film that protects the memory columnar body 127 during a later step. The high permittivity film is formed by aluminum oxide ($Al_2O_3$), zirconium oxide ($ZrO_2$), or hafnium oxide ($HfO_2$), for example. The cover film is formed by silicon oxide ($SiO_2$), for example. Next, a portion in the bottom part of the memory hole 145 of the semiconductor film 123 is selectively removed by, for example, reactive ion etching, wet etching, or a combination of these. Next, the semiconductor film 122 is deposited on a sidewall of the semiconductor film 123. The semiconductor film 122 is formed by amorphous silicon (a-Si), for example. The semiconductor films 122 and 123 configure the channel semiconductor layer 124 and function as a body of the memory unit MU. Next, the core oxide film 121 is implanted on the inside of the semiconductor film 122. The core oxide film 121 is formed by silicon oxide ($SiO_2$), for example. By steps so far, the stacked body shown in FIG. 8 is formed on the semiconductor substrate 101.

Next, a plurality of the element isolation trenches 146 that have the Z direction as their depth direction and have the X direction as their extension direction are formed from the inter-layer insulating layer 144 to the inter-layer insulating layer 141, by anisotropic etching, for example. Next, the semiconductor layer 148 that has appeared in a bottom part of the element isolation trench 146 is doped with an n type impurity such as phosphorus (P), for example, by ion implantation or vapor phase diffusion, for example. By this step, a portion doped with the n type impurity, of the semiconductor layer 148 becomes the n type impurity region 149, and another portion of the semiconductor layer 148 becomes the p type impurity region 148. Next, the sacrifice layers 161-163 are removed by wet etching via the element isolation trench 146, for example. In the case there is a cover film, it is here removed. Note that after formation of the element isolation trench 146, a surface of the semiconductor layer 103 exposed in the bottom part of the element isolation trench 146 may be oxidized after doping of the semiconductor layer 103 with the n type impurity or after removal of the sacrifice layers 161-163. Next, the conductive layers 104-106 are deposited by a chemical vapor deposition method, for example. The conductive layers 104-106 are configured from a stacked film of titanium nitride (TiN) and tungsten (W) or molybdenum (Mo), for example. Next, portions left on a sidewall of the element isolation trench 146, of the conductive layers 104-106 are etched back. Finally, the insulating layer 147 is implanted in the element isolation trench 146 by a reduced pressure chemical vapor deposition method, for example. The insulating layer 147 is formed by silicon oxide ($SiO_2$), for example. By steps so far, the memory cell array 100 shown in FIG. 5 is formed on the semiconductor substrate 101.

That concludes the manufacturing steps of the memory cell array 100.

Next, the erase operation and the write operation of the semiconductor memory device comprising the memory cell array 100 of the above-described structure, will be described.

Figure 9:
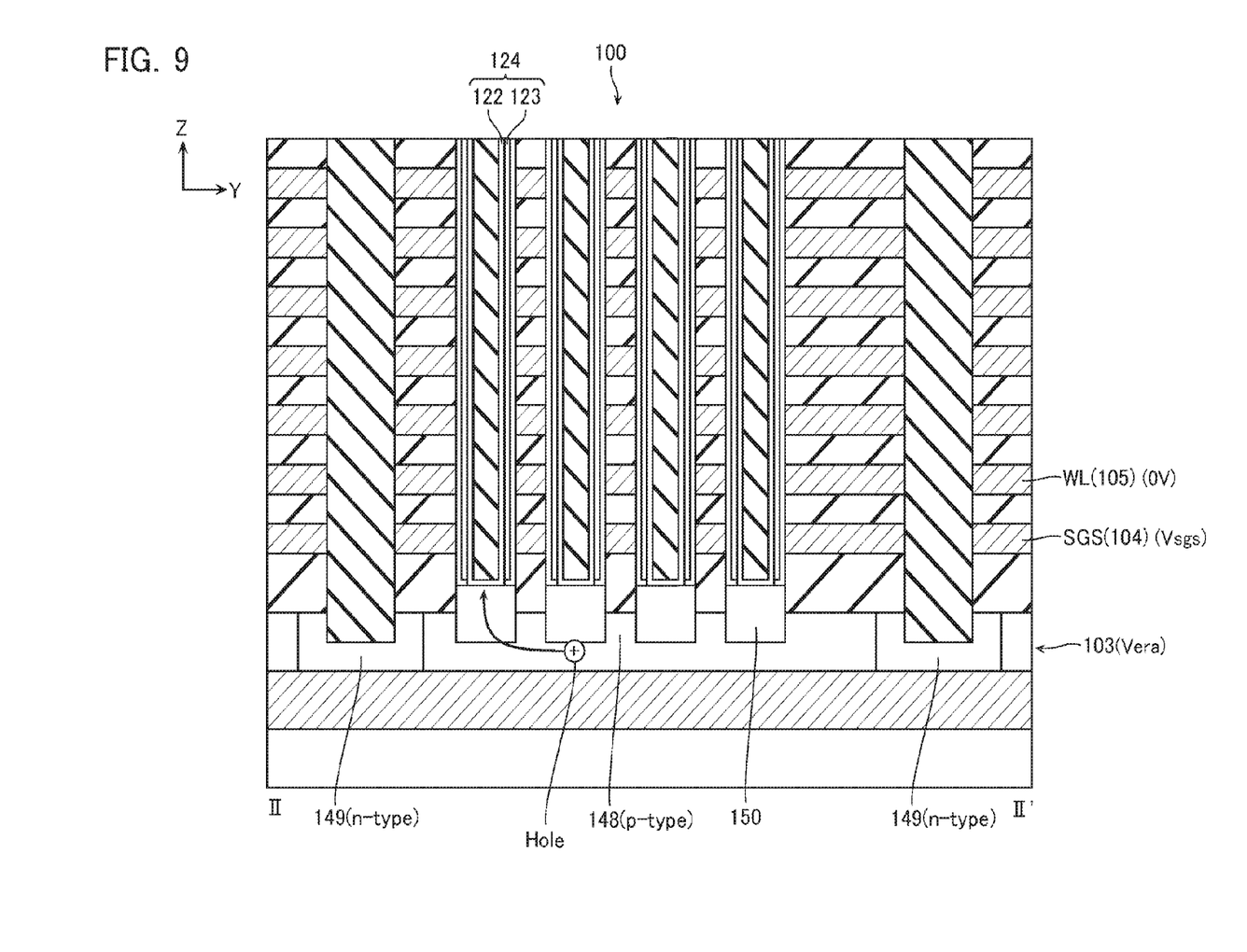
FIG. 9 is a view explaining an erase operation of the semiconductor memory device according to the same embodiment.
Figure 10:
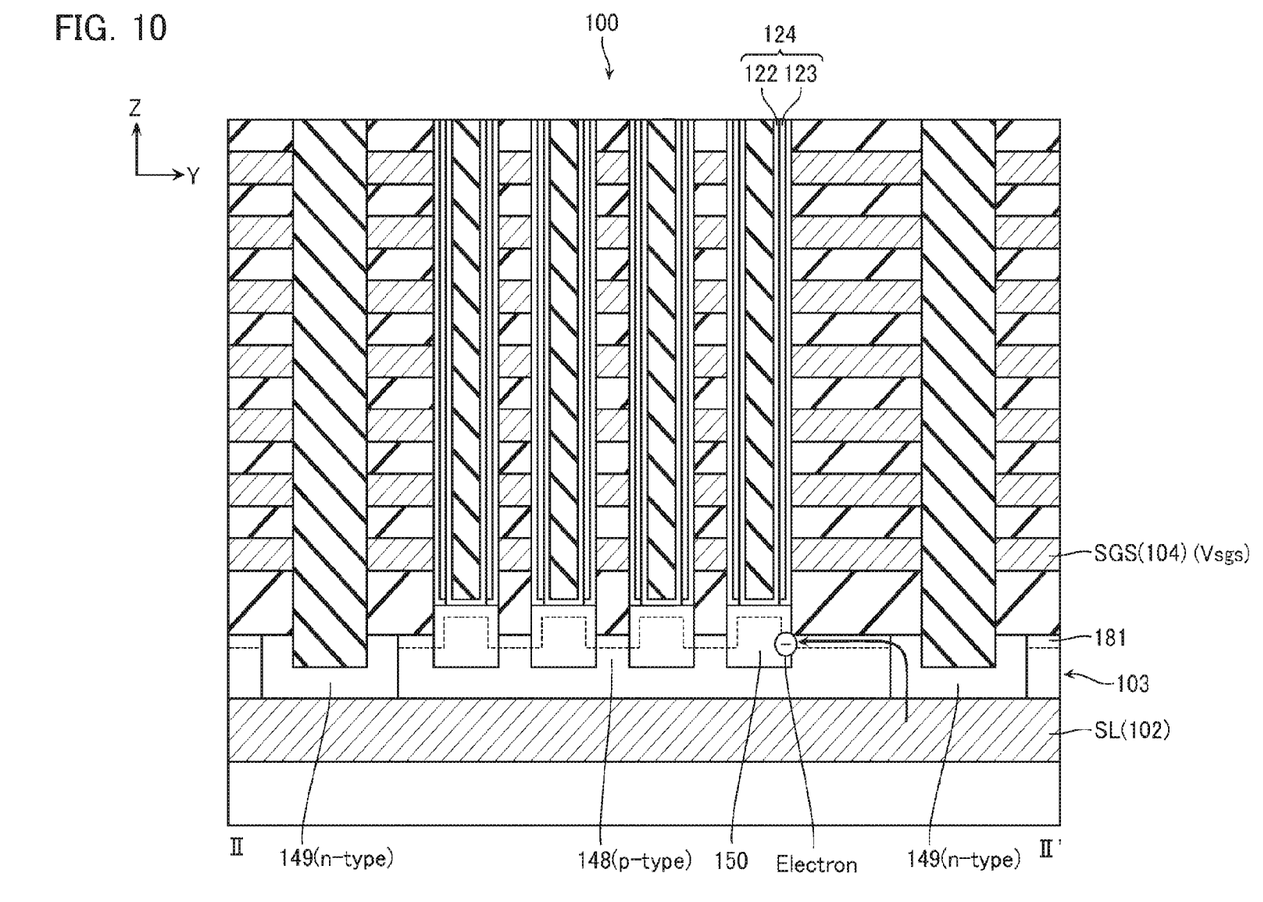
FIG. 10 is a view explaining a read operation of the semiconductor memory device according to the same embodiment.

FIG. 9 is a view explaining the erase operation of the semiconductor memory device according to the present embodiment, and FIG. 10 is a view explaining the read operation of the same semiconductor memory device. FIGS. 9 and 10 are cross-sectional views in the Y-Z directions taken along the line II-II' of FIG. 6.

In the erase operation, the word line WL(105) of a selected memory block MB representing an erase target is applied with 0 V, the semiconductor layer 103 of the same memory block MB is applied with an erase voltage Vera, and the source side select gate line SGS(104) of the same memory block MB is applied with a voltage Vsgs of a degree that holes are accumulated. Thereupon, the channel semiconductor layer 124 also attains the same erase voltage Vera as the semiconductor layer 103. As a result, as shown in FIG. 9, due to a potential difference between the word line WL and the channel semiconductor layer 124, a hole of the p type impurity region 148 of the semiconductor layer 103 is injected into the charge accumulation film 126 via the channel semiconductor layer 124. As a result, data of all of the memory cells MC of the selected memory block MB is erased.

On the other hand, in the read operation, although a cell current flowing in a selected memory cell MC representing a read target needs to be led to the source line SL(102), it cannot be led directly due to the existence of the semiconductor layer 103. Accordingly, by application of the voltage Vsgs to the source side select gate line SGS(104), an inversion layer 181 is formed in upper parts of the p type impurity region 148 and the semiconductor portion 150 of the semiconductor layer 103. As a result, as shown in FIG. 10, the following path of an electron is formed, namely, source line SL type impurity region 149→inversion layer 181 of p type impurity region 148 and semiconductor portion 150 channel semiconductor layer 124, and the source line SL and channel semiconductor layer 124 are electrically connected. As a result, a cell current Icell flows from the channel semiconductor layer 124 to the source line SL, and data of the memory cell MC is read.

When the memory cell array adopts a three-dimensional structure as in the semiconductor memory device according to the present embodiment, not only can a higher density level of memory cells be achieved, but it is also possible to increase the number of conductive layers without an accompanying increase in the number of lithography steps. Furthermore, when the semiconductor memory device comprises a memory cell array of a so-called "buried source line" type where the source line is disposed between the semiconductor substrate and the memory string as in the present embodiment, the element isolation trench need not be implanted with a conductive line electrically connecting between the semiconductor substrate and the source line, hence the element isolation trench can be made shallow. However, in many cases where a buried source line type memory cell array was employed, a so-called GIDL (Gate-Induced-Drain-Leakage current) system erase operation was adopted, hence it was a problem that a peripheral circuit increased.

In that respect, the present embodiment has the p type impurity region 148 disposed on the source line SL to adopt a so-called well system erase operation, hence due to the present embodiment, the peripheral circuit is smaller compared to when the GIDL system erase operation is adopted. Furthermore, since the source line SL is formed by a metal or a metal compound, resistance of the source line SL is reduced, whereby a high-speed access operation is enabled.

From the above, the present embodiment makes it possible to provide a semiconductor memory device whose chip area is small and which is capable of a high-speed access operation.

Second Embodiment

A second embodiment is a modified example of the first embodiment related to the n type impurity region.

Figure 11:
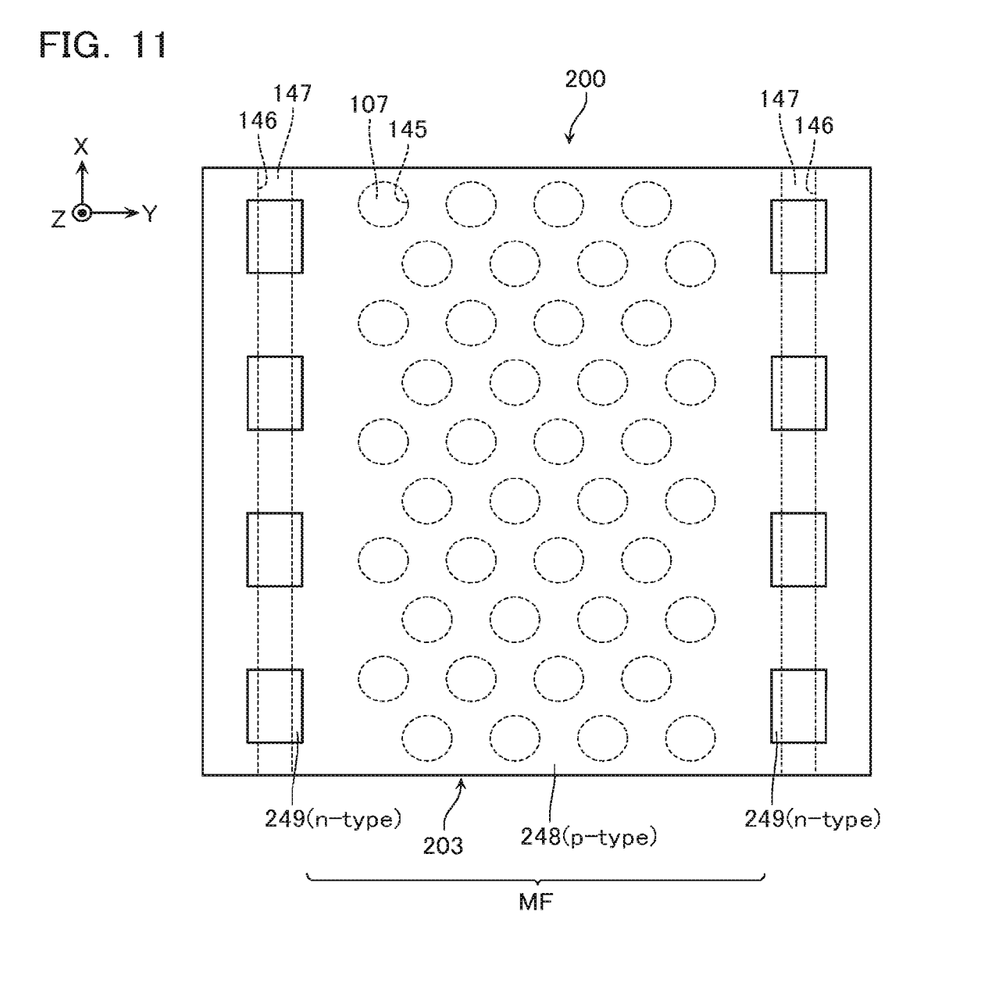
FIG. 11 is a cross-sectional view showing a layout of a semiconductor layer of a memory cell array of a semiconductor memory device according to a second embodiment.

FIG. 11 is a cross-sectional view showing a layout of a semiconductor layer of a memory cell array of a semiconductor memory device according to the present embodiment. FIG. 11 is a cross-sectional view in the X-Y directions as seen from the Z direction. Configurations shown in FIG. 11 that are the same as those shown in FIG. 5 are assigned with the same reference symbols as those assigned in FIG. 5.

In the case of the memory cell array 100 of the first embodiment, after formation of the element isolation trench 146, the semiconductor layer 103 that appeared in the bottom part of that element isolation trench 146 was doped with an n type impurity. In contrast, in the case of a memory cell array 200 of the present embodiment, after stacking of a semiconductor layer 203 (corresponding to the semiconductor layer 103 of the memory cell array 100) doped with a p type impurity such as boron (B) on the source line SL, an n type impurity region 249 is formed at a position where in a later step the element isolation trench 146 will be formed, by lithography and ion implantation, for example. This n type impurity region 249 is a region doped with an n type impurity such as phosphorus (P) disposed in an island-like manner intermittently along the X direction.

In the memory cell array 100 of the first embodiment, the n type impurity region 149 was linear having a certain width and formed continuously in the X direction, hence fellow memory fingers MF adjacent in the Y direction were not electrically conductive with each other due to a pn junction.

In this respect, in the memory cell array 200 of the present embodiment, the n type impurity region 249 is island-like formed intermittently in the X direction, and fellow p type impurity regions 248 between memory fingers MF adjacent in the Y direction can be provided continuously, being not completely isolated by the n type impurity region 249. As a result, voltage boost of the semiconductor layer 203 during an erase operation on the memory fingers MF that have fellow p type impurity regions 248 electrically conductive with each other, can be performed simultaneously in a unit of these plurality of memory fingers MF.

From the above, the present embodiment makes it possible to provide a semiconductor memory device that not only can achieve similar advantages to those of the first embodiment, but that also can have its peripheral circuit simplified hence have a smaller chip area, compared to the first embodiment.

Third Embodiment

A third embodiment differs from the first embodiment in being an example where the p type impurity region and the n type impurity region of the semiconductor layer are reversely disposed.

First, a structure of a memory cell array 300 of the present embodiment will be described.

Figure 12:
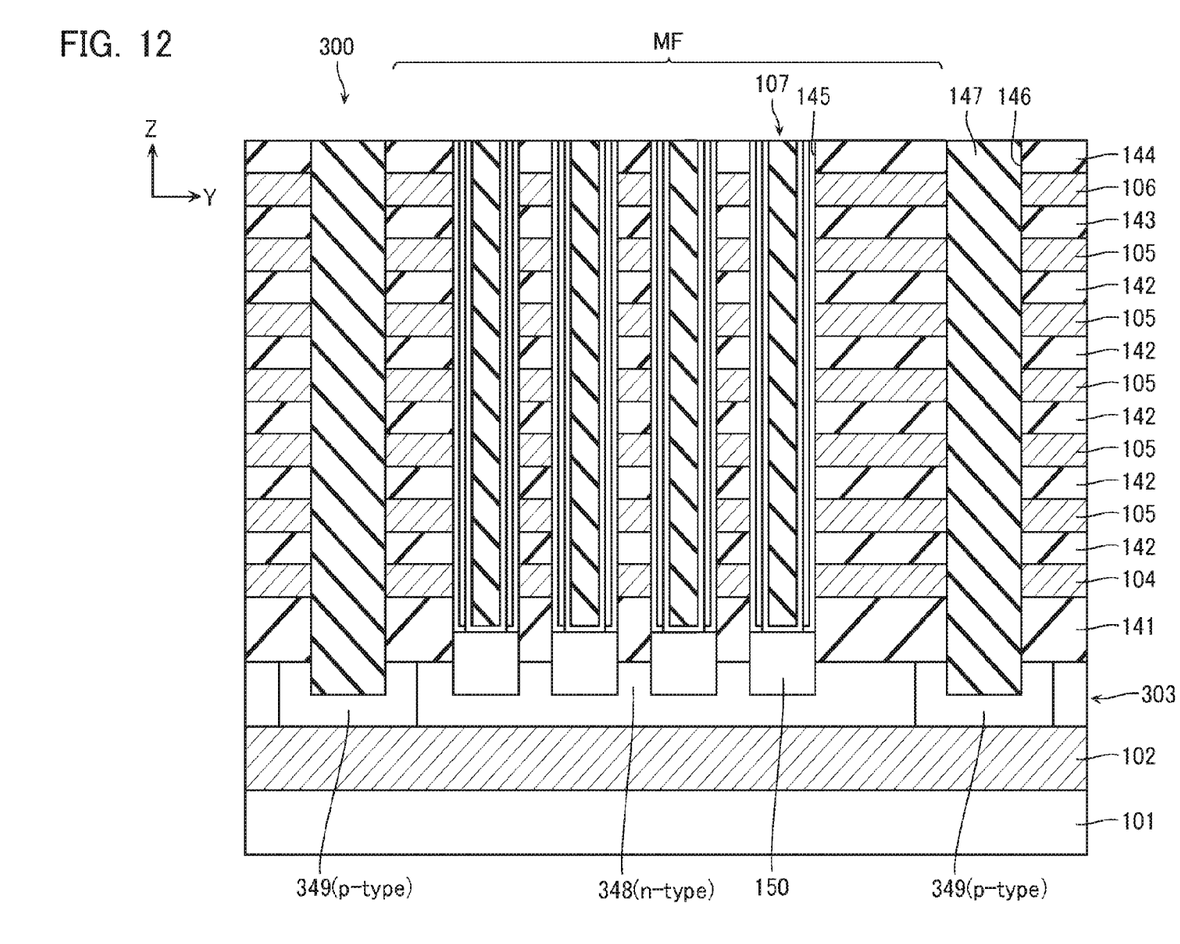
FIG. 12 is a cross-sectional view of a memory cell array of a semiconductor memory device according to a third embodiment.

FIG. 12 is a cross-sectional view of the memory cell array of the semiconductor memory device according to the present embodiment. FIG. 12 is a cross-sectional view in the Y-Z directions. Configurations shown in FIG. 12 that are the same as those shown in FIG. 5 are assigned with the same reference symbols as those assigned in FIG. 5.

The memory cell array 300 comprises a semiconductor layer 303 in place of the semiconductor layer 103 of the memory cell array 100. This semiconductor layer 303 includes: an n type impurity region 348 disposed at a position of the memory columnar body 107 as viewed from the Z direction; p type impurity regions 349 adjacent to this n type impurity region 348 so as to sandwich the n type impurity region 348 in the Y direction; and the semiconductor portion 150. The n type impurity region 348 is formed by a semiconductor such as polysilicon (Poly-Si) including an n type impurity such as phosphorus (P), for example. The p type impurity region 349 is formed by a semiconductor such as polysilicon (Poly-Si) including a p type impurity such as boron (B), for example.

Note that in the case of FIG. 12, the p type impurity region 349 is disposed at a position of the insulating layer 147 as viewed from the Z direction, but may be disposed at any position provided it is adjacent to the n type impurity region 348. Moreover, the p type impurity region 349 may be linear extending continuously in the X direction and having a certain width, similarly to the n type impurity region 149 of the memory cell array 100, or may be provided in an island-like manner intermittently along the X direction, similarly to the n type impurity region 249 of the memory cell array 200.

Next, an erase operation and a read operation of the semiconductor memory device comprising the memory cell array 300 of the above-described structure, will be described.

Figure 13:
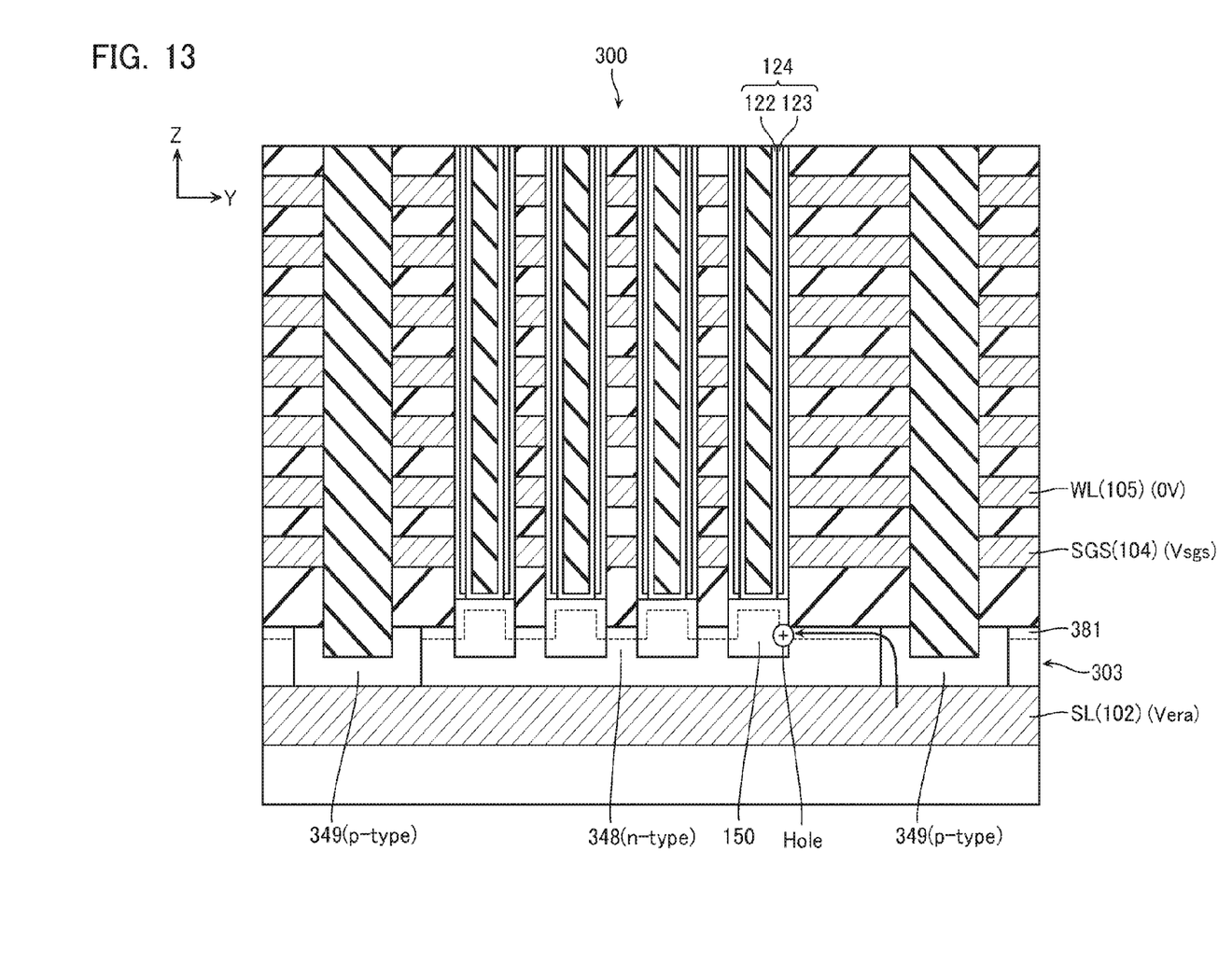
FIG. 13 is a view explaining an erase operation of the semiconductor memory device according to the same embodiment.
Figure 14:
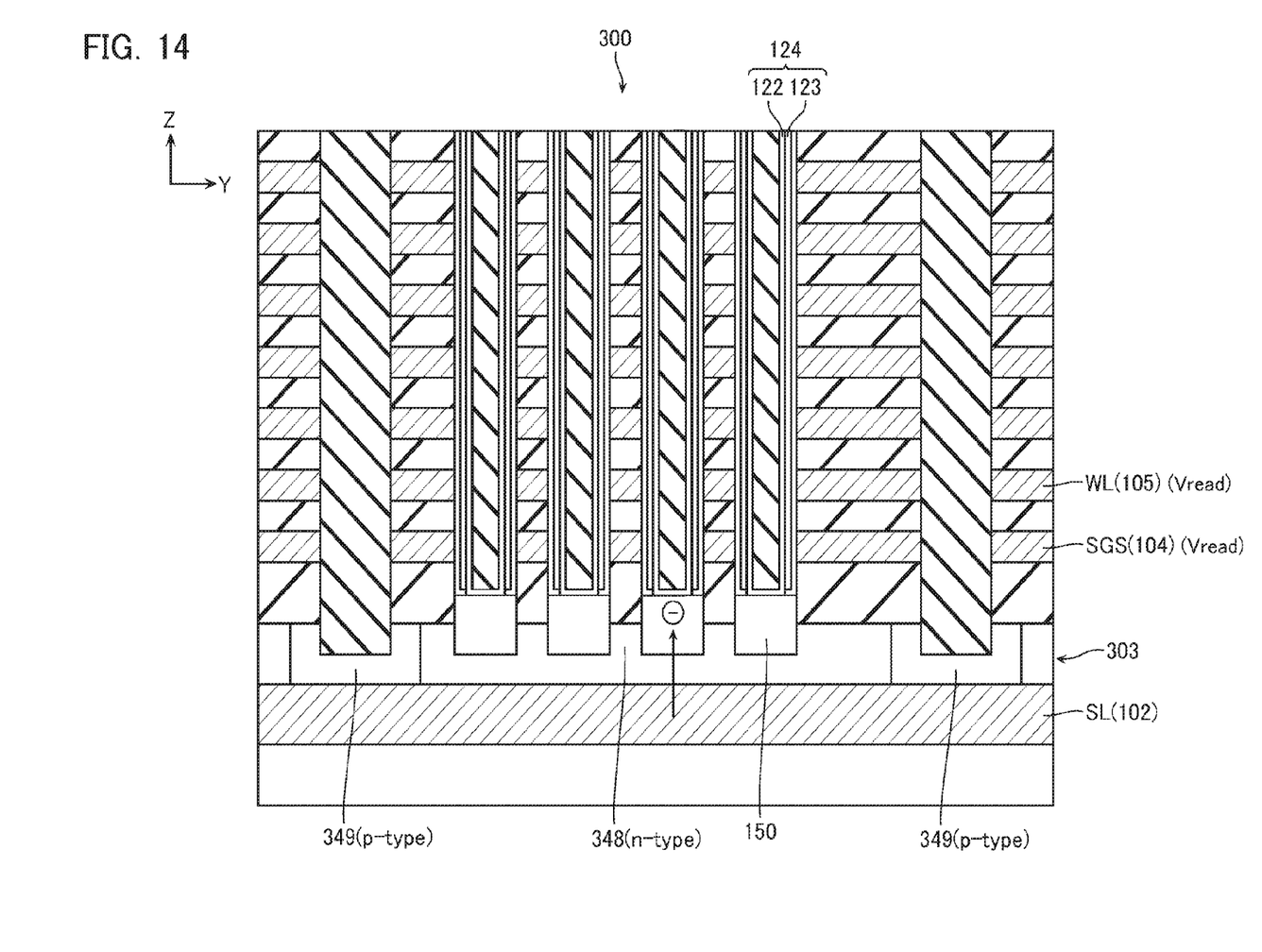
FIG. 14 is a view explaining a read operation of the semiconductor memory device according to the same embodiment.

FIG. 13 is a view explaining the erase operation of the semiconductor memory device according to the present embodiment, and FIG. 14 is a view explaining the read operation of the same semiconductor memory device. FIGS. 13 and 14 are cross-sectional views in the Y-Z directions.

In the erase operation, the word line WL(105) of the selected memory block MB representing the erase target is applied with 0 V, the source line SL(102) of the same memory block MB is applied with the erase voltage Vera, and the source side select gate line SGS(104) of the same memory block MB is applied with a voltage Vsgs of a degree that an inversion layer 381 is formed in upper parts of the n type impurity region 348 and the semiconductor portion 150. Thereupon, the following path of a hole is formed, namely, source line SL→p type impurity region 349→inversion layer 381 of n type impurity region 348 and semiconductor portion 150→channel semiconductor layer 124. In this case, the channel semiconductor layer 124 is boosted to the erase voltage Vera, hence, due to the potential difference between the word line WL and the channel semiconductor layer 124, a hole of the source line SL is injected into the charge accumulation film 126 via the channel semiconductor layer 124. As a result, data of all of the memory cells MC of the selected memory block MB is erased.

On the other hand, in the read operation, since the n type impurity region 348 and the channel semiconductor layer 124 are in contact with each other, if the source side select gate line SGS(104) is applied with the read voltage Vread similarly to the word line WL(105), then a cell current (electron) flows between the source line SL(102) and the channel semiconductor layer 124. As a result, data of the memory cell MC can be read.

In the first embodiment, the inversion layer 181 was formed in the upper part of the p type impurity region 148 by the voltage of the source side select gate line SGS, and a read operation utilizing this was performed. In this case, in order to stabilize the read operation, the following were required, namely, control of variation in film thickness of the inter-layer insulating layer 141 between the p type impurity region 148 and the source side select gate line SGS, and selection of an appropriate material of the inter-layer insulating layer 141.

In that respect, the present embodiment makes it possible to provide a semiconductor memory device that, because it does not utilize the inversion layer of the n type impurity region during the read operation, is capable of a more stable read operation compared to those of the first and second embodiments.

OTHERS

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
a first semiconductor layer; and
a memory cell array on the first semiconductor layer, the memory cell array including a source line, a second semiconductor layer, and a conductive layer, those are sequentially disposed in a first direction and the memory cell array further including a third semiconductor layer which is columnar and extends in the first direction and a charge accumulation film disposed between the conductive layer and the third semiconductor layer,
wherein the second semiconductor layer includes a first impurity region of a first conductivity type disposed at a position of the third semiconductor layer as viewed from the first direction and a second impurity region adjacent to the first impurity region which has a second conductivity type different from the first conductivity type.
2. The semiconductor memory device according to claim 1, wherein
the source line is made of metal or silicon having a certain impurity.

3. The semiconductor memory device according to claim 1, wherein
the first conductivity type is p type and the second conductivity type is n type.

4. The semiconductor memory device according to claim 1, wherein
the first conductivity type is n type and the second conductivity type is p type.

5. The semiconductor memory device according to claim 1, wherein
the second semiconductor layer includes a first portion projecting toward the first direction at a position of a bottom of the third semiconductor layer as viewed from the first direction.

6. The semiconductor memory device according to claim 1, wherein
the charge accumulation film is supplied with a first charge from the first impurity region of the second semiconductor layer.

7. The semiconductor memory device according to claim 1, wherein
the charge accumulation film is supplied with a second charge from the source line via the second impurity region and an inversion layer formed in the first impurity region of the second semiconductor layer.

8. The semiconductor memory device according to claim 1, wherein
the second semiconductor layer includes a plurality of the second impurity regions sandwiching the first impurity region.

9. The semiconductor memory device according to claim 1, wherein
the second impurity region of the second semiconductor layer is disposed intermittently in a third direction intersecting the first and second directions.

10. A semiconductor memory device, comprising:
a first semiconductor layer;
a source line disposed on the first semiconductor layer;
a second semiconductor layer disposed on the source line, the second semiconductor layer including a first impurity region with a first conductivity type and a second impurity region with a second conductivity type;
a stacked body in which a plurality of films of insulating layers and conductive layers being alternately stacked on the second semiconductor layer;
a plurality of third semiconductor layers which are columnar and are disposed on the first impurity region of the second semiconductor layer in the stacked body; and
a memory cell including a charge accumulation film which is provided at each of intersections of the third semiconductor layer and the conductive layer of the stacked body,
the first impurity region of the second semiconductor layer contacting an end of the third semiconductor layer, and at least both sides of the first impurity region of the second semiconductor layer being partitioned by the second impurity region.

11. The semiconductor memory device according to claim 10, wherein
the source line is a metal line, or silicon including an impurity.

12. The semiconductor memory device according to claim 10, wherein
the second impurity region is a linear region having a certain width, or an island-like region disposed intermittently along a first direction.

13. The semiconductor memory device according to claim 12, comprising
a plurality of memory regions where the third semiconductor layers are disposed,
wherein in-between each of the memory regions is isolated by the second impurity region of the linear region.

14. The semiconductor memory device according to claim 12, comprising
a plurality of memory regions where the third semiconductor layers are disposed,
wherein one portion of in-between each of the memory regions is isolated by the second impurity region of the island-like region, and another portion of in-between each of the memory regions is linked.

15. The semiconductor memory device according to claim 10, wherein
the first conductivity type is p type and
the second conductivity type is n type.

16. The semiconductor memory device according to claim 10, wherein
the second semiconductor layer includes a first portion projecting toward a first direction at a position of a bottom of the third semiconductor layer as viewed from the first direction.

17. The semiconductor memory device according to claim 10, wherein
the charge accumulation film is supplied with a first charge from the first impurity region of the second semiconductor layer and is supplied with a second charge from the source line via the second impurity region and an inversion layer formed in the first impurity region of the second semiconductor layer.

18. The semiconductor memory device according to claim 10, wherein
the second semiconductor layer includes a plurality of the second impurity regions sandwiching the first impurity region.

19. The semiconductor memory device according to claim 10, wherein
the second impurity region of the second semiconductor layer is disposed at a position of the insulating layer as viewed from a first direction.

* * * * *